US008109432B2

(12) United States Patent  
Shoji et al.

(10) Patent No.: US 8,109,432 B2  
(45) Date of Patent: Feb. 7, 2012

(54) METHOD FOR ATTACHMENT OF SOLDER POWDER TO ELECTRONIC CIRCUIT BOARD AND SOLDER-ATTACHED ELECTRONIC CIRCUIT BOARD

(75) Inventors: Takashi Shoji, Tokyo (JP); Takekazu Sakai, Tokyo (JP); Tetsuo Kubota, Chichibu (JP)

(73) Assignee: Showa Denko K.K., Tokyo (JP)

( * ) Notice: Subject to any disclaimer, the term of this patent is extended or adjusted under 35 U.S.C. 154(b) by 0 days.

(21) Appl. No.: 12/013,246

(22) Filed: Jan. 11, 2008

(65) Prior Publication Data

US 2008/0173699 A1 Jul. 24, 2008

Related U.S. Application Data

(63) Continuation-in-part of application No. PCT/JP2006/314019, filed on Jul. 7, 2006.

(60) Provisional application No. 60/701,088, filed on Jul. 21, 2005.

(30) Foreign Application Priority Data

Jul. 11, 2005 (JP) ................................. 2005-201567

(51) Int. Cl.  
B23K 31/02 (2006.01)

(52) U.S. Cl. .................................. 228/248.1; 427/96.1

(58) Field of Classification Search .................. None  
See application file for complete search history.

(56) References Cited

U.S. PATENT DOCUMENTS

| | | | |
|---|---|---|---|
| 4,081,576 A | 3/1978 | Hensel et al. | |
| 4,572,103 A | 2/1986 | Engel | |
| 4,777,804 A * | 10/1988 | Bowling et al. | 62/85 |
| 4,872,928 A * | 10/1989 | Jacobs | 148/24 |
| 5,205,439 A | 4/1993 | Sturm | |
| 5,277,333 A | 1/1994 | Shimano | |
| 5,339,842 A * | 8/1994 | Bok | 134/1 |
| 5,346,118 A | 9/1994 | Degani et al. | |
| 5,506,385 A | 4/1996 | Murakami et al. | |
| 5,556,023 A | 9/1996 | Kuramoto et al. | |
| 5,653,820 A * | 8/1997 | Higashino | 134/29 |
| 5,674,326 A * | 10/1997 | Wrezel et al. | 148/24 |
| 5,713,997 A | 2/1998 | Kuramoto et al. | |
| 5,750,271 A | 5/1998 | Kuramoto et al. | |
| 5,787,578 A | 8/1998 | Farooq et al. | |
| 5,922,978 A | 7/1999 | Carroll | |
| 5,928,440 A | 7/1999 | Kuramoto et al. | |
| 5,960,251 A * | 9/1999 | Brusic et al. | 428/551 |
| 5,972,051 A * | 10/1999 | Leroux et al. | 29/25.01 |
| 5,976,965 A | 11/1999 | Takahashi et al. | |
| 6,066,551 A | 5/2000 | Satou et al. | |
| 6,070,788 A | 6/2000 | Zakel | |
| 6,169,022 B1 | 1/2001 | Saitou | |
| 6,214,636 B1 * | 4/2001 | Sawayama et al. | 438/57 |
| 6,219,910 B1 * | 4/2001 | Murali | 29/840 |
| 6,239,013 B1 * | 5/2001 | Hotchkiss | 438/616 |
| 6,249,963 B1 | 6/2001 | Chou et al. | |
| 6,264,093 B1 | 7/2001 | Pilukaitis et al. | |
| 6,273,100 B1 * | 8/2001 | Andreas et al. | 134/1.3 |
| 6,423,154 B1 * | 7/2002 | Van Gerven et al. | 148/24 |
| 6,518,163 B2 * | 2/2003 | Sakuyama et al. | 438/613 |
| 6,551,650 B1 | 4/2003 | Carre et al. | |
| 6,866,733 B1 | 3/2005 | Denham et al. | |
| 6,871,776 B2 * | 3/2005 | Trucco | 228/234.1 |
| 6,982,484 B2 | 1/2006 | Ogura et al. | |
| 7,775,417 B2 | 8/2010 | Shoji et al. | |
| 2001/0008160 A1 * | 7/2001 | Suzuki et al. | 156/64 |
| 2001/0020744 A1 * | 9/2001 | Kuramoto et al. | 257/738 |
| 2002/0000462 A1 * | 1/2002 | Mead et al. | 228/248.1 |
| 2002/0124646 A1 * | 9/2002 | Mokuo | 73/299 |
| 2002/0148881 A1 * | 10/2002 | Trucco | 228/201 |
| 2003/0007136 A1 * | 1/2003 | Emoto et al. | 355/30 |
| 2003/0019918 A1 | 1/2003 | Farooq et al. | |
| 2003/0029908 A1 * | 2/2003 | Suzuki et al. | 228/180.22 |
| 2003/0037804 A1 * | 2/2003 | Erdmann | 134/9 |
| 2003/0089891 A1 * | 5/2003 | Andreas | 252/500 |
| 2003/0091789 A1 * | 5/2003 | Koskenmaki et al. | 428/138 |
| 2003/0127501 A1 | 7/2003 | Cheng et al. | |
| 2003/0209585 A1 | 11/2003 | Katayama | |
| 2003/0221748 A1 * | 12/2003 | Arzadon et al. | 148/23 |
| 2004/0124230 A1 * | 7/2004 | Hertz et al. | 228/201 |
| 2004/0135251 A1 | 7/2004 | Tellkamp et al. | |
| 2004/0146659 A1 | 7/2004 | Bednarz et al. | |
| 2004/0250919 A1 * | 12/2004 | Saito et al. | 148/25 |
| 2005/0184129 A1 | 8/2005 | Godijn et al. | |
| 2006/0270575 A1 * | 11/2006 | Kim et al. | 510/176 |
| 2007/0086147 A1 | 4/2007 | Kawamura et al. | |

(Continued)

FOREIGN PATENT DOCUMENTS

CN 1168195 12/1997

(Continued)

OTHER PUBLICATIONS machine translation of JP-7-94853A.*  
Powder Technology Handbook, 2nd Ed., edited by Society of Powder Technology, Japan, 1998, pp. 19-20, published by the Nikkan Kogyo Shimbun, Ltd., Tokyo, Japan.  
Chinese Application No. 2007800327321.9 Office Action dated Sep. 27, 2010.  
Supplementary European Search Report for EP 07 79 1891 dated Apr. 23, 2010.  
TW Notification for the Opinion of Examination, dated Jul. 23, 2009, issued in corresponding TW Application No. 095110694, 25 pages in English and Chinese.

(Continued)

*Primary Examiner* — Kiley Stoner  
(74) *Attorney, Agent, or Firm* — Sughrue Mion, PLLC

(57) ABSTRACT

A method for the attachment of solder powder includes the steps of treating an exposed metallic surface of an electronic circuit board with a tackifier compound, thereby imparting tackiness thereto to form a tackified part, attaching solder powder by a dry or wet process to the tackified part, and then removing excessively adhering solder powder in a liquid that is water, deoxidized water or deoxidized water added with an antirust.

8 Claims, No Drawings

U.S. PATENT DOCUMENTS

| | | | |
|---|---|---|---|
| 2007/0215172 A1* | 9/2007 | Watanabe et al. | 134/1 |
| 2007/0284136 A1* | 12/2007 | Sakai et al. | 174/255 |
| 2007/0292988 A1* | 12/2007 | Nakabayashi | 438/108 |
| 2009/0041990 A1* | 2/2009 | Shoji et al. | 428/195.1 |
| 2009/0056977 A1 | 3/2009 | Shoji et al. | |
| 2009/0261148 A1 | 10/2009 | Shoji et al. | |
| 2010/0038411 A1 | 2/2010 | Shoji et al. | |

FOREIGN PATENT DOCUMENTS

| | | |
|---|---|---|
| DE | 43 40 396 | 6/1995 |
| DE | 19535622 | 9/1996 |
| EP | 0 595 343 | 5/1994 |
| EP | 1 569 503 | 8/2005 |
| JP | 01-318280 | 12/1989 |
| JP | 02-012830 | 1/1990 |
| JP | 03-000152 | 1/1991 |
| JP | 04-051521 | 2/1992 |
| JP | 4-51521 A * | 2/1992 |
| JP | 05-048258 A | 2/1993 |
| JP | 5-255876 A * | 10/1993 |
| JP | 06-045740 | 2/1994 |
| JP | 7-7244 A * | 1/1995 |
| JP | 07-007244 A | 1/1995 |
| JP | 407030234 A * | 1/1995 |
| JP | 07-074457 A * | 3/1995 |
| JP | 7-94853 A * | 4/1995 |
| JP | 07094853 A * | 4/1995 |
| JP | 05160095 A * | 6/1995 |
| JP | 07-212022 | 8/1995 |
| JP | 07288255 | 10/1995 |
| JP | 08-018222 | 1/1996 |
| JP | 9-1382 A * | 1/1997 |
| JP | 09-199506 | 7/1997 |
| JP | 11-008272 A | 1/1999 |
| JP | 11121907 A * | 4/1999 |
| JP | 11-240612 A | 9/1999 |
| JP | 2000-82873 | 3/2000 |
| JP | 2001-311005 | 11/2001 |
| JP | 2002-076062 | 3/2002 |
| JP | 2002-257516 | 9/2002 |
| JP | 2003-37217 | 2/2003 |
| JP | 2003-332375 | 11/2003 |
| JP | 2005011884 A * | 1/2005 |
| JP | 2005-354043 | 12/2005 |
| JP | 2006-136935 | 6/2006 |
| JP | 2006-278650 | 10/2006 |
| JP | 2006-351559 A | 12/2006 |
| JP | 2007-73869 | 3/2007 |
| KR | 10-0315763 | 2/2002 |
| TW | 472513 | 11/2002 |
| TW | 590880 | 6/2004 |
| TW | 594891 | 6/2004 |
| TW | 200507707 A | 2/2005 |
| WO | 86/00842 | 2/1986 |
| WO | 2002/005607 | 1/2002 |
| WO | 2005109977 | 11/2005 |
| WO | 2006/104238 | 10/2006 |
| WO | 2007/029866 | 3/2007 |

* cited by examiner

METHOD FOR ATTACHMENT OF SOLDER POWDER TO ELECTRONIC CIRCUIT BOARD AND SOLDER-ATTACHED ELECTRONIC CIRCUIT BOARD

CROSS REFERENCE TO RELATED APPLICATIONS

This application is a continuation-in-part application of PCT Application No. PCT/JP2006/314019 filed Jul. 7, 2006 under 35 U.S.C. §111(a) claiming the benefit pursuant to 35 U.S.C. §119(e)(1) of the filing dates of Provisional Application No. 60/701,088 filed Jul. 21, 2005 and Japanese Patent Application No. 2005-201567 filed Jul. 11, 2005 pursuant to 35 U.S.C. §111(b).

TECHNICAL FIELD

This invention relates to a method for finely attaching solder powder exclusively to an exposed fine metallic face of an electronic circuit board (inclusive of a printed-wiring assembly), a method for fusing the solder powder and forming a thin solder layer on the exposed metallic face with the object of mounting an electronic part on the electronic circuit board, and an electronic pan using the solder-attached electronic circuit board.

BACKGROUND ART

In recent years, electronic circuit boards that have an electronic circuit pattern formed on an insulating substrate, such as a plastic substrate (possibly film), ceramic substrate or metallic substrate coated with plastic have been developed. Means for configuring an electronic circuit by soldering electronic pats, such as IC devices, semiconductor chips, resistors and condensers, on the wiring face have been widely adopted.

In this case, for the purpose of bonding the lead terminal of an electronic part to the prescribed part of a circuit pattern, the procedure generally followed comprises preparatorily forming a thin solder layer on the surface of an electrically conductive circuit electrode exposed on the electronic circuit board, printing solder paste or flux, positioning and mounting a prescribed electronic part and subsequently causing the thin solder layer alone or the thin solder layer and the solder paste together to reflow, thereby completing a bond with the solder.

Recently, the trend of electronic products toward miniaturization has been urging their electronic circuits to use fine pitches. Parts of fine pitches, such as LSIs of the QFP (Quad Flat Package) type and the CSPs (Chip Size Packages) having a pitch of 0.3 mm and FCs (Flip Chips) having a pitch of 0.15 mm, have come to be copiously mounted in small areas. For this reason, the electronic circuit boards have come to need fine solder circuit patterns in conformity with the fine pitches.

For the purpose of forming soldered circuits with solder film on an electronic circuit board, the plating method, the HAL (Hot Air Leveler) method or the method which consists in printing a paste of solder powder and causing the paste to reflow is available. The method for producing a soldered circuit by the plating technique encounters difficulty in forming the solder layer in a necessary thickness and the HAL method and the method utilizing the print of solder paste encounter difficulty in attaining conformity with fine pitch patterns.

As a means for forming a soldered circuit without necessitating troublesome operations, such as alignment of circuit patterns, a method which comprises imparting tackiness to the surface of the electrically conductive circuit electrode of an electronic circuit board by causing a tackifier compound to react with the surface, attaching solder powder to the tackified part and subsequently heating the electronic circuit board, thereby fusing the solder and forming a bonded circuit has been disclosed (refer, for example, to JP-A HEI 7-7244).

Owing to the method disclosed in the prior art, it has become possible to provide an electronic circuit board of high reliability by having a fine solder circuit pattern formed by a simple procedure. Since this method attaches solder powder in a dry state to the electronic circuit board, it inevitably suffers the powder to be attached as by static electricity to an irrelevant part other than the necessary portion and even to be excessively attached to the exposed metallic surface of the electronic circuit board. Thus, the desirability of developing a technique for efficiently removing the excess solder powder afterward has been finding acceptance. When the dry procedure is used at all, however, the drift of powder and the like ensue and obstruct use of fine pitches in the electronic circuit board. Besides, the excessively attached solder powder somewhat undergoes oxidation during the course of the dry treatment and entails persistently a problem regarding the reuse of recovered solder powder. This problem gains in prominence particularly when the solder powder to be used has a very minute particle size.

This invention, in a method for producing an electronic circuit board by treating the exposed metallic surface (the surface of an electronically conductive circuit electrode) on an electronic circuit board with a tackifier compound, thereby imparting tackiness thereto, attaching solder powder to the tackified part, and then heating the electronic circuit board, thereby melting the solder and forming a soldered circuit, is aimed at providing a method for the attachment of solder powder which is capable of realizing as fine a circuit pattern as possible, a method for producing a solder-attached electronic circuit board by a procedure of causing the attached solder powder to reflow in accordance with the method mentioned above, an electronic circuit board possessing a fine circuit pattern and exhibiting high reliability, an electronic circuit board having mounted thereon an electronic part capable of realizing high reliability and high mounting density, and a method for the reuse of solder powder inducing no appreciable degradation during the course of attachment of solder powder.

The present inventor, after making diligent effort and study with a view to solving the problems mentioned above, has reached this invention. To be specific, this invention has solved the problems mentioned above by developing the following items.

DISCLOSURE OF THE INVENTION

The first aspect of the invention provides a method for the attachment of solder powder, comprising the steps of treating an exposed metallic surface of an electronic circuit board with a tackifier compound, thereby imparting tackiness thereto to form a tackified part, attaching solder powder by a dry or wet process to the tackified part, and then removing excessively adhering solder powder in a liquid.

In the method according to the second aspect of the invention including the first aspect, the liquid is water.

In the method according to the third aspect of the invention including the second aspect the water is deoxidized water.

In the method according to the fourth aspect of the invention including the third aspect, the deoxidized water is deoxidized water added with an antirust.

The fifth aspect of the invention provides a method for the production of a soldered electronic circuit board, comprising the steps of treating an electronic circuit board with a tackifier compound, thereby imparting tackiness exclusively to an exposed part of a metallic circuit to form a tackified part, attaching solder powder by a dry or wet process to the tackified part, then removing excessively adhering solder powder in a liquid kept vibrated, and subjecting the resultant board to thermal fusion, thereby forming a circuit.

In the method according to the sixth aspect of the invention including the fifth aspect, the liquid contains the tackified compound comprising at least one member selected from the group consisting of naphthotriazole-based derivatives, benzotriazole-based derivatives, imidazole-based derivatives, benzoimidazole-based derivatives, mercaptobenzothiazole-based derivatives and benzothiazole thio-fatty acid-based derivatives, and the tackified part is formed by immersing the exposed part of the metallic circuit on the electronic circuit board in the liquid or by applying the liquid to the exposed part.

In the method according to the seventh aspect of the invention including the sixth aspect, the tackified part is formed at a treating temperature of 30 to 60° C. for a treating time 5 sec to 5 min.

In the method according to the eighth aspect of the invention including the fifth aspect, the liquid kept vibrated is a liquid having supersonic vibration imparted thereto.

The ninth aspect of the invention provides a solder-attached electronic circuit board produced by using the method according to any one of the fifth to eighth aspects.

The tenth aspect of the invention provides a method for mounting an electronic part, comprising the steps of mounting an electronic part on the solder-attached electronic circuit board according to the ninth aspect and causing a solder to reflow, thereby bonding the electronic part to the board.

The eleventh aspect of the invention provides an electronic circuit board having mounted thereon the electronic part produced by the method according to the tenth aspect.

The twelfth aspect of the invention provides a method for the production of a solder-attached electronic circuit board, comprising the steps of imparting tackiness exclusively to an exposed part of a metallic circuit on an electronic circuit board by a treatment with a tackifier compound to form a tackified part, attaching solder powder to the tackified part by a dry or wet process, removing excessively attached solder powder in a liquid, recovering the removed solder powder and reusing the removed solder powder.

Owing to the method for the attachment of solder powder by dry attachment of solder powder and wet removal thereof and the method for the production of an electronic circuit board by the use of that method, both contemplated by this invention, it has become possible to form a fine solder circuit pattern by a simple procedure and reuse recovered solder powder. Particularly, these methods enable the fine circuit pattern to attain an effect of decreasing short circuits with a solder metal between adjoining circuit patterns and conspicuously enhance reliability of the electronic circuit board. Owing to the method for the production of an electronic circuit board also contemplated by this invention, it has become possible to realize miniaturization of a circuit board having mounted thereon an electronic part and impartation of high reliability thereto as well and provide an electronic apparatus of excellent characteristics.

BEST MODE FOR CARRYING OUT THE INVENTION

The electronic circuit boards that constitute subjects of this invention are plastic substrates, plastic film substrates, glass fabric substrates, paper-matrix epoxy resin substrates, substrates formed by stacking a metal sheet on ceramic substrates, single-sided electronic circuit boards produced by forming a circuit pattern on insulated substrates having a metal base material coated with plastic or ceramic using an electrically conductive substance, such as metal, dual electronic circuit boards, multilayer electronic circuit boards, flexible electronic circuit boards or the like.

This invention consists in a method for producing a solder-attached electronic circuit board by treating the electrically conductive circuit electrode on the electronic circuit board, for example, with a tackifier compound, thereby imparting tackiness to the electrode surface, attaching solder powder to the tackified part, efficiently removing in a liquid the excess solder powder as attached by virtue of static electricity to a portion other than the electrically conductive circuit electrode surface aimed at and the excess solder powder attached to the electrically conductive circuit electrode surface in an amount more than necessary, and subsequently heating the electric circuit board, thereby fusing the attached solder and forming a solder circuit.

As the electrically conductive substance intended to form the circuit, copper is used in most cases. This invention does not need to limit this substance to copper but allows use of an electrically conductive substance that is enabled, by a tackifier compound specifically described herein below, to acquire tackiness on the surface. As concrete examples of the substance, substances that contain Ni, Sn, Ni—Au alloy, solder alloy, etc. may be cited.

As concrete examples of the tackifier compound which is preferably used in this invention, naphthotriazole-based derivatives, benzotriazole-based derivatives, imidazole-based derivatives, benzoimidazole-based derivatives, mercaptobenzothiazole-based derivatives and benzothiazole thio-fatty acid-based derivatives may be cited. While these tackifier compounds manifest a particularly strong effect to copper, they are capable of imparting tackiness to other electrically conductive substances as well.

The benzotriazole-based derivatives are represented by general formula (1).

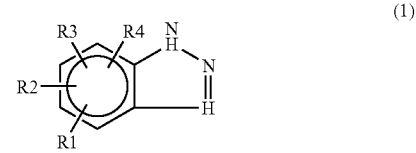

(1)

In this invention, R1 to R4 in general formula (1) independently denote a hydrogen atom, an alkyl group having a carbon number in the range of 1 to 16, preferably in the range of 5 to 16, an alkoxy group, F, Br, Cl, I, a cyano group, an amino group or an OH group.

These compounds, as the benzotriazole-based derivatives represented by general formula (1), generally gain in tackiness in accordance as the number of carbon atoms increases.

The naphthotriazole-based derivatives are represented by general formula (2).

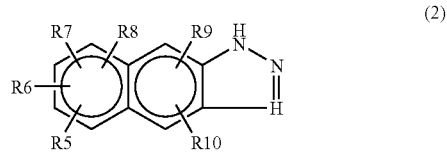

(2)

In this invention, R5 to R10 in general formula (2) independently denote a hydrogen atom, an alkyl group having a carbon number in the range of 1 to 16, preferably in the range of 5 to 16, an alkoxy group, F, Br, Cl, I, a cyano group, an amino group or an OH group.

The imidazole-based derivatives are represented by general formula (3).

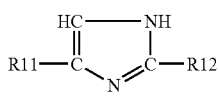
(3)

In this invention, R11 and R12 in general formula (3) independently denote a hydrogen atom, an alkyl group having a carbon number in the range of 1 to 16, preferably in the range of 5 to 16, an alkoxy group, F, Br, Cl, I, a cyano group, an amino group or an OH group.

The benzoimidazole-based derivatives are represented by general formula (4).

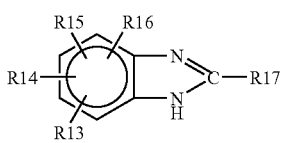
(4)

In this invention, R13 to R17 in general formula (4) independently denote a hydrogen atom, an alkyl group having a carbon number in the range of 1 to 16, preferably in the range of 5 to 16, an alkoxy group, F, Br, Cl, I, a cyano group, an amino group or an OH group.

The imidazole-based derivatives and the benzoimidazole-based derivatives represented by the general formula (3) and the general formula (4) generally gain in stickiness in accordance as the numbers of carbon atoms are increased.

The mercaptobenzothiazole-based derivatives are represented by general formula (5).

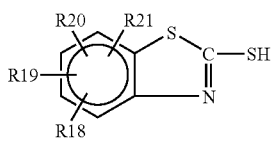
(5)

In this invention, R18 to R21 in general formula (5) independently denote a hydrogen atom, an alkyl group having a carbon number in the range of 1 to 16, preferably in the range of 5 to 16, an alkoxy group, F, Br, Cl, I, a cyano group, an amino group or an OH group.

The benzothiazole thio-fatty acid-based derivatives are represented by general formula (6).

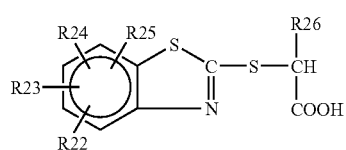
(6)

In this invention, R22 to R26 in general formula (6) independently denote a hydrogen atom, an alkyl group having a carbon number in the range of 1 to 16, preferably of either 1 or 2, an alkoxy group, F, Br, Cl, I, a cyano group, an amino group or an OH group.

In the benzothiazole thio-fatty acid-based derivatives represented by general formula (6), R22 to R26 are each preferred to have a number of 1 or 2.

In this invention, with a view to imparting tackiness to the surface of an electrically conductive circuit electrode on an electronic circuit board, at least one of the tackifier compounds mentioned above is dissolved in water or an acid water and preferably adjusted to a slightly acid quality of about pH 3 to pH 4 and then put to use. As substances usable for the adjustment of pH, inorganic acids, such as hydrochloric acid, sulfuric acid, nitric acid and phosphoric acid, may be cited when the electrically conductive substance happens to be a metal. As organic acids, formic acid, acetic acid, propionic acid, malic acid, oxalic acid, malonic acid, succinic acid, tartaric acid and the like are usable. Though the concentration of the tackifier compound is not rigidly limited, it is properly adjusted to suit solubility and situation of use. Preferably, the concentration in the range of 0.05 mass % to 20 mass % generally allows easy use. If the concentration is lower than this range, the shortage will prevent the tacky film from being formed fully satisfactorily, a fact that proves unfavorable for performance.

When the treating temperature is elevated somewhat from room temperature, the tacky film is enabled to improve the speed of formation and the amount of formation. Though the treating temperature is not limited but is varied with the concentration of the tackifier compound and the kind of metal, it is generally preferable in the range of 30° C. to 60° C. Though the treating time is not limited, it is preferable from the viewpoint of the efficiency of operation to adjust the other conditions so that the treating time may fall in the approximate range of 5 seconds to 5 minutes.

In this case, the solution which has copper (univalent or divalent) exist therein as ions in a concentration of 100 to 1000 ppm is at an advantage in enhancing efficiencies of formation, such as speed of formation and amount of formation of the tacky film.

The electronic circuit board to be treated is preferably subjected to the treatment with the solution of a tackifier compound after the electrically conductive circuit part needing no solder has been covered with resist, for example, and after the electrically conductive circuit electrode part of a circuit pattern (the metal surface exposed on the board) has been exclusively left exposed.

Here, the impartation of tackiness to the surface of the electrically conductive circuit is accomplished by having the electronic circuit board immersed in the solution of a tackifier compound to be used herein, or coated with the solution, or sprayed with the solution.

As examples of the metallic composition of solder powder to be used in the method for the production of an electronic circuit board contemplated by this invention, Sn—Pb based alloy, Sn—Pb—Ag based alloy, Sn—Pb—Bi based alloy, Sn—Pb—Bi—Ag based alloy and Sn—Pb—Cd based alloy may be cited. Also from the recent point of view of the exclusion of Pb from the industrial waste, Sn—In based alloy, Sn—Bi based alloy, In—Ag based alloy, In—Bi based alloy, Sn—Zn based alloy, Sn—Ag based alloy, Sn—Cu based alloy, Sn—Sb based alloy, Sn—Au based alloy, Sn—Bi—Ag—Cu based alloy, Sn—Ge based alloy, Sn—Bi—Cu based alloy, Sn—Cu—Sb—Ag based alloy, Sn—Ag—Zn based alloy, Sn—Cu—Ag based alloy, Sn—Bi—Sb based alloy, Sn—Bi—Sb—Zn based alloy, Sn—Bi—Cu—Zn based alloy, Sn—Ag—Sb based alloy, Sn—Ag—Sb—Zn based alloy, Sn—Ag—Cu—Zn based alloy and Sn—Zn—Bi based alloy prove to be preferable examples.

As concrete examples of the metallic composition mentioned above, the eutectic solder composed of 63 mass % of Sn and 37 mass % of Pb (hereinafter indicated as 63Sn/37Pb) as the center and 62Sn/36Pb/2Ag, 62.6Sn/37Pb/0.4Ag, 60Sn/40Pb, 50Sn/50Pb, 30Sn/70Pb, 25Sn/75Pb, 10Sn/88Pb/2Ag, 46Sn/8Bi/46Pb, 57Sn/3Bi/40Pb, 42Sn/42Pb/14Bi/2Ag, 45Sn/40Pb/15Bi, 50Sn/32Pb/18Cd, 48Sn/52In, 43Sn/57Bi, 97In/3Ag, 58Sn/42In, 95In/5Bi, 60Sn/40Bi, 91Sn/9Zn, 96.5Sn/3.5Ag, 99.3Sn/0.7Cu, 95Sn/5Sb, 20Sn/80Au, 90Sn/10Ag, 90Sn/7.5Bi/2Ag/0.5Cu, 97Sn/3Cu, 99Sn/1Ge, 92Sn/7.5Bi/0.5Cu, 97Sn/2Cu/0.8Sb/0.2Ag, 95.5Sn/3.5Ag/1Zn, 95.5Sn/4Cu/0.5Ag, 52Sn/45Bi/3Sb, 51 Sn/45Bi/3Sb/1Zn, 85Sn/10Bi/5Sb, 84Sn/10Bi/5Sb/1Zn, 88.2Sn/10Bi/0.8Cu/1Zn, 89Sn/4Ag/7Sb, 88Sn/4Ag/7Sb/1Zn, 98Sn/1Ag/1Sb, 97Sn/1Ag/1Sb/1Zn, 91.2Sn/2Ag/0.8Cu/6Zn, 89Sn/8Zn/3Bi, 86Sn/8Zn/6Bi and 89.1Sn/2Ag/0.9Cu/8Zn may be cited. As the solder powder to be used in this invention, a mixture of two or more kinds of solder powders differing in composition is conceivable.

When the electronic circuit board of this invention is manufactured by using an alloy composition selected from the Pb-free solders among other solder powders enumerated above and particularly preferably from the solders containing Sn and Zn or Sn and Zn and Bi, the product is capable of promoting elongation of the service life of a mounted part and comprising diversification of parts.

As regards the particle diameter of the solder powder, Japanese Industrial Standard (JIS) specifies such ranges of 53 to 22 µm, 45 to 22 µm and 38 to 22 µm which are measured by sieving. For the determination of the average particle diameter of the solder powder of this invention, the method that relies on the standard sieve and the balance specified by JIS may be generally used. Besides, the image analysis with a microscope and the coal tar counter according to the electrozone method are available for the determination. The coal tar counter, the principle of which is published in "Powder Engineering Handbook" (compiled by Powder Engineering Society, second edition, pp. 19-10), consists in determining the particle size distribution of a powder by causing a solution having the powder dispersed therein to pass through a pore opened in a diaphragm and measuring the change of electric resistance between the opposite sides of the pore. It is, therefore, capable of determining the number ratio of particle diameters with good reproducibility. The average particle diameter of the solder powder contemplated by this invention can be fixed by using the method described above.

This invention is characterized by carrying out the attachment of the solder powder to the electronic circuit board provided in advance with tackiness by the conventional dry or wet procedure and carrying out the removal of the excessively attached solder powder in a liquid. By implementing the removal of the excessively attached solder powder in the liquid, it is made possible to prevent the solder powder from being attached by static electricity to the part lacking tackiness during the process of removal or prevent the solder powder from being aggregated by static electricity and realize formation of a circuit board of fine pitches and adoption of fine solder powder.

When the attachment of the solder powder is implemented by a dry process, the electronic circuit board, such as a plastic board, liable to assume static electricity tends to generate static electricity when the plastic surface thereof is rubbed with a brush for the purpose of removing the excessively attached solder powder. When the solder powder happens to be in a fine size, it tends to attach even to the part not provided with tackiness and also to the part needing no attachment and induce occurrence of short circuits between circuit patterns.

This invention has solved the trouble due to static electricity and the like by implementing the removal of the excessive solder powder in the liquid.

When the attachment of the solder powder to the electronic circuit board provided in advance with tackiness is implemented in a liquid, this attachment is accomplished by having the printed-wiring assembly immersed in a liquid having the solder powder dispersed therein. This attachment of the solder powder is favorably fulfilled by imparting vibration, preferably vibration in the range of 0.1 Hz to several kHz, and particularly preferably low-frequency vibration, to the dispersion of solder powder. The concentration of the solder powder in the liquid during the attachment of solder powder in the liquid is preferably in the range of 0.5 to 10 apparent volume % and more preferably in the range of 3 to 8 apparent volume %.

In this invention, it is preferable to use water as the liquid that is needed in the attachment of solder powder. The addition of a corrosion inhibitor to the liquid proves advantageous for the purpose of preventing the solder powder from being oxidized with the dissolved oxygen in the liquid.

As the liquid to be used in the step for removing the excessively attached solder powder by a wet or dry process, water or a mixed solvent formed be water and a water-soluble organic solvent having a low boiling point is available. It is water that proves to be preferable in consideration of problems, such as environmental pollution.

When the recycle of solder powder is taken into consideration, deoxidized water and/or water having added a corrosion inhibitor is advantageous for the purpose of preventing the solder powder from being oxidized with the dissolved oxygen in the liquid. As the deoxidized water, the water degasified by heating or the water bubbled with an inert gas, such as carbon dioxide gas or nitrogen, can be used. The liquid may be the water having added a corrosion inhibitor or the water resulting from adding a corrosion inhibitor to the deoxidized water. When such deoxidized water and/or such water having added a corrosion inhibitor is us it is conveniently recovered and reused because the water is capable of preventing the surface of the recovered solder powder from being oxidized. When the corrosion inhibitor is used, the use of the deoxidized water proves advantageous because the water using the corrosion inhibitor will possibly require a rinsing treatment afterward.

In this invention, the removal of the excess solder powder in the liquid may be implemented by having the electronic circuit board immersed in the liquid or sprayed with the liquid. Though the removal of the excess solder powder may be fulfilled by stroking the surface of the electronic circuit board as with a brush, it is preferable to impart vibration, preferably vibration in the range of 0.1 Hz to several hundred Hz, or ultrasonic waves to the liquid. During the removal of the solder powder in the liquid, the solder powder in the liquid can be easily recovered without inducing a drift because it readily settles to the bottom of the liquid.

For the purpose of preventing the solder powder used in this invention from being oxidized, it is preferable to have the surface of the solder powder coated. The coating agents that are available for the solder powder include benzothiazole derivatives, amines having an alkyl group of a carbon number of 4 to 10 in the side chain, thiourea, silane coupling agents, lead, tin, gold, inorganic acid salts and organic acid salts, for example. The coating is preferably implemented by using at least one of the coating agents enumerated above. As the organic acid salt, it is preferable to use at least one member selected from the group consisting of lauric acid, myristic acid, palmitic acid and stearic acid.

The method of treatment contemplated by this invention can be effectively used not only for the solder-precoated circuit board described above but also for the formation of a bump intended for BGA (Ball Grid Array) bonding. Naturally, it is incorporated in the electronic circuit board contemplated by this invention.

The electronic circuit board that has undergone the removal of the excess solder powder and the attachment of solder powder to the tackified part is dried and then subjected to the process of reflowing to induce thermal fusion of the attached solder powder and formation of a solder-attached circuit board. Since the heating involved herein is only required to fuse the solder powder attached to the tackified part, the treating temperature and the treating time can be easily fixed in consideration of the melting point of the solder powder and the like.

Since the excess solder powder removed from the electronic circuit board in the liquid can be easily separated from the liquid, it is collected, dried under an inoxidizable atmosphere and recycled to the process for dry attachment of solder powder. During the course of the drying, the surface of the solder powder is preferably coated with the aforementioned coating agent when the circumstance permits. When the method for attaching the powder in water is adopted, the settled powder is recovered and put to use as it is.

The solder-attached electronic circuit board fabricated by this invention can be ideally used in a method for mounting an electronic part comprising the steps of mounting an electronic part and bonding the electronic part by the reflow of solder. To the solder-attached electronic circuit board fabricated by this invention, for example, the electronic part can be, bonded by applying solder paste as by the printing technique to the part of the board to which the electronic part is expected to be bonded, mounting the electronic part thereon, subsequently heating the relevant components, thereby fusing the solder powder in the solder paste, and solidifying the fused solder powder.

As a means to bond (method for mounting) the electronic part and the solder-attached electronic circuit board obtained by the method of this invention, the Surface-Mount Technology (SMT), for example, can be used. In this mounting method, the solder paste is first applied by the printing technique to the electronic circuit board such as, for example, an arbitrarily selected portion of the circuit pattern. Then, the electronic parts, such as chip parts and QFP, are mounted on the applied layer of the solder paste and they are collectively bonded with solder by virtue of a reflowing heat source. As the reflowing heat source, a hot-air oven, an infrared heating furnace, a steam condensing soldering device and a light-beam soldering device can be used.

The reflowing process of this invention varies with the solder alloy composition. In the case of the alloy composition of the Sn—Zn based alloy, such as 91Sn/9Zn, 89Sn/8Zn/3Bi or 86Sn/8Zn/6Bi, the two-step process that consists of preheating and reflowing proves favorable. As regards the conditions for this process, the preheating temperature is in the range of 130 to 180° C., preferably 130 to 150° C., the preheating time is in the range of 60 to 120 seconds, preferably 60 to 90 seconds, the reflowing temperature is in the range of 210 to 230° C., preferably 210 to 220° C., and the reflowing time is in the range of 30 to 60 seconds, preferably 30 to 40 seconds. The reflowing temperature in the case of other types of alloy compositions is in the range of 20 to 50° C.+the melting point of the alloy to be used, preferably 20 to 30° C.+the melting point of the alloy. The other preheating temperature, preheating time and reflowing time may be in the same ranges as mentioned above.

The reflowing process can be implemented in nitrogen or in the air. In the case of the nitrogen reflowing, by setting the oxygen concentration at 5 apparent volume % or less, preferably 0.5 apparent volume % or less, it is made possible to enhance the wetting property of solder relative to the solder-attached circuit, suppress the occurrence of solder balls and ensure a stable treatment as compared with the air reflowing.

Thereafter, the electronic circuit board is cooled to complete the surface mounting. In the method for producing an electronic circuit board according to this mounting technique, the opposite surfaces of the electronic circuit board may be used for bonding. As concrete examples of the electronic part that can be used in the method for mounting an electronic part contemplated by this invention, LSIs, resistors, condensers, transformers, inductances, filters, oscillators and transducers may be cited, though not exclusively.

EXAMPLE

A printed-wiring assembly having the smallest electrode interval of 30 μm was fabricated. Copper was used for the electrically conductive circuits.

As the solution of a tackifier compound, an aqueous 2 mass % solution of an imidazole-based compound of general formula (3), in which R12 was an alkyl group of $C_{11}H_{23}$ and R11 was a hydrogen atom, was used after having the pH thereof adjusted with acetic acid to about 4. The aqueous solution was heated to 40° C. and the printed-wiring assembly pretreated with an aqueous solution of hydrochloric acid was immersed in the aqueous solution for 3 minutes, with the result that a tacky substance was formed on the surface of copper circuits.

Subsequently, the printed-wiring assembly had the electrodes thereof contact a 96.5Sn/3.5Ag solder powder having an average particle diameter of 10 μm by a dry technique.

Four printed-wiring assemblies each having the electrodes thereof that have the above solder powder attached thereto were prepared. In one of them, the powder attached to the part not needing soldering was blown out with air jet by a dry technique. Another one was immersed in water for 30 sec while imparting vibration of 1 MHz thereto to try to remove the excess powder. Yet another one was immersed in water for 30 sec while imparting vibration of 10 MHz thereto to try to remove the excess powder. The remaining one was rinsed with water shower for 30 sec while imparting vibration of 1 MHz thereto.

Each of the resultant four printed-wiring assemblies was placed in an oven at 240° C. to induce fusion of the solder powder and formation of a thin layer of 96.5Sn/3.5Ag solder in a thickness of about 10 μm on the exposed part of the copper circuit.

The produced solder-attached printed-wiring assemblies were subjected to visual examination. The solder condition of the electrodes of the assembly having the excess solder powder blown out with air jet by the dry technique was good though it had a bridge partially formed.

Each of the three remaining assemblies had no bridge formed and exhibited the best solder condition of the electrodes thereof.

The results of the visual examination are shown in Table 1 below, in which ○ stands for the good solder condition and ⊚ for the best solder condition.

TABLE 1

| Method for removal of powder | Outward appearance | |
|---|---|---|
| | Bridge | Solder condition of electrode |
| Dry technique (air) | Partly formed | ○ |
| Vibration (1 MHz): Immersed in water for 30 sec | None | ◎ |
| Vibration (10 MHz): Immersed in water for 30 sec | None | ◎ |
| Vibration (1 MHz): Water shower for 30 sec | None | ◎ |

INDUSTRIAL APPLICABILITY

The method for producing a solder-attached electronic circuit board provided with a soldered circuit and obtained by imparting tackiness to the exposed metallic part on the board, attaching the solder powder to the tackified part, removing the excessively attached solder powder in a liquid and heating the electronic circuit board resulting from the removal of the excessive powder to induce fusion of solder, acquires an effect of decreasing the occurrence of short circuits with the solder metal between the adjoining circuit patterns of a fine size and permits production of a solder-attached electronic circuit board exhibiting conspicuously enhanced reliability.

As a result, it is made possible to realize miniaturization of and impartation of high reliability to a circuit board that has mounted thereon electronic parts possessing a fine circuit pattern and abounding in reliability and provide an electronic circuit board, a circuit board having mounted therein electronic parts realizing high reliability and high mounting density, and an electronics device excelling in characteristic properties.

The invention claimed is:

1. A method for the attachment of solder powder, comprising the steps of treating an exposed metallic surface of an electronic circuit board with a tackifier compound comprising at least one member selected from a group consisting of naphthotriazole-based derivatives, benzotriazole-based derivatives, imidazole-based derivatives, benzoimidazole-based derivatives, mercaptobenzothiazole-based derivatives and benzothiazole thio-fatty acid-based derivatives, thereby imparting tackiness thereto to form a tackified part, attaching solder powder by a wet process to the tackified part, the wet process performed using water, and then removing excessively adhering solder powder by immersing the circuit board in deoxidized water and imparting ultrasonic vibration to the deoxidized water.

2. A method according to claim 1, wherein the deoxidized water is added with an antirust.

3. A method for the production of a solder-attached electronic circuit board, comprising the steps of imparting tackiness exclusively to an exposed part of a metallic circuit on an electronic circuit board by a treatment with a tackifier compound comprising at least one member selected from a group consisting of naphthotriazole-based derivatives, benzotriazole-based derivatives, imidazole-based derivatives, benzoimidazole-based derivatives, mercaptobenzothiazole-based derivatives and benzothiazole thio-fatty acid-based derivatives to form a tackified part, attaching solder powder to the tackified part by a wet process performed using water, removing excessively attached solder powder by immersing the circuit board in deoxidized water and imparting ultrasonic vibration to the deoxidized water, recovering the removed solder powder and reusing the removed solder powder.

4. A method accord to claim 1, wherein the removal step comprises imparting vibration in the range of 1 MHz to 10 MHz.

5. A method accord to claim 3, wherein the removal step comprises imparting vibration in the range of 1 MHz to 10 MHz.

6. A method according to claim 1, wherein the step of attaching the solder powder to the tackified part is fulfilled by imparting vibration.

7. A method for the attachment of solder powder, comprising the steps of treating an exposed metallic surface of an electronic circuit board with a tackifier compound comprising at least one member selected from a group consisting of naphthotriazole-based derivatives, benzotriazole-based derivatives, imidazole-based derivatives, benzoimidazole-based derivatives, mercaptobenzothiazole-based derivatives and benzothiazole thio-fatty acid-based derivatives, thereby imparting tackiness thereto to form a tackified part, attaching solder powder by a wet process to the tackified part, the wet process performed using water, and then removing excessively adhering solder powder by immersing the circuit board in a liquid and imparting ultrasonic vibration to the liquid.

8. A method for the production of a solder-attached electronic circuit board, comprising the steps of imparting tackiness exclusively to an exposed part of a metallic circuit on an electronic circuit board by a treatment with a tackifier compound comprising at least one member selected from a group consisting of naphthotriazole-based derivatives, benzotriazole-based derivatives, imidazole-based derivatives, benzoimidazole-based derivatives, mercaptobenzothiazole-based derivatives and benzothiazole thio-fatty acid-based derivatives to form a tackified part, attaching solder powder to the tackified part by a wet process performed using water, removing excessively attached solder powder by immersing the circuit board in a liquid and imparting ultrasonic vibration to the liquid, recovering the removed solder powder and reusing the removed solder powder.

\* \* \* \* \*